US006955964B2

(12) United States Patent
Haselden et al.

(10) Patent No.: US 6,955,964 B2
(45) Date of Patent: Oct. 18, 2005

(54) FORMATION OF A DOUBLE GATE STRUCTURE

(75) Inventors: Barbara A. Haselden, Cupertino, CA (US); John Lee, Cupertino, CA (US)

(73) Assignee: ProMOS Technologies, Inc., Hsin Chu (TW)

( * ) Notice: Subject to any disclaimer, the term of this patent is extended or adjusted under 35 U.S.C. 154(b) by 38 days.

(21) Appl. No.: 10/702,711

(22) Filed: Nov. 5, 2003

(65) Prior Publication Data

US 2005/0095783 A1 May 5, 2005

(51) Int. Cl.$^7$ .......................................... H01L 21/8247
(52) U.S. Cl. ...................................... 438/257; 438/719
(58) Field of Search ............................. 438/257–267, 438/719

(56) References Cited

U.S. PATENT DOCUMENTS

| 5,933,729 A | * | 8/1999 | Chan | 438/257 |
| 6,458,655 B1 | * | 10/2002 | Yuzuriha et al. | 438/257 |
| 2003/0134472 A1 | * | 7/2003 | Yang | 438/257 |

* cited by examiner

*Primary Examiner*—Richard A. Booth
(74) *Attorney, Agent, or Firm*—MacPherson Kwok Chen & Heid LLP; David S. Park

(57) ABSTRACT

A method of forming a double gate structure including sidewalls of substantially similar vertical profile. One photoresist masking step is used to define the top gate, which is then used as a mask to define the bottom gate. The bottom polysilicon layer is etched by a physical and chemical process combination to form a bottom gate with vertical sidewalls substantially inline with the sidewalls of the top gate.

23 Claims, 5 Drawing Sheets

FORMATION OF A DOUBLE GATE STRUCTURE

BACKGROUND OF THE INVENTION

1. Field of Invention

The present invention generally relates to semiconductor processing. More particularly, the present invention relates to forming a double gate structure during semiconductor device fabrication.

2. Discussion of the Related Art

With the ever-increasing number of semiconductor devices being built on a single chip, achieving vertical sidewall profiles in semiconductor devices has become an important aspect of modern semiconductor and integrated circuit technology. As composite films get thinner with shrinking transistors, volume production of memory semiconductors depends on meeting the process margins of profile and selectivity requirements simultaneously.

A high degree of etch anisotropy is desirable to produce vertical sidewalls for gate structures, thereby conforming to the required critical dimension for submicron geometries from the top to the bottom of the gate structures. A low degree of etch anisotropy will produce problems such as undesirable sloping sidewalls, causing deviations from the required critical dimension.

FIG. 1 illustrates examples of a double gate structure, including an upper gate 14 formed over a bottom gate 12, which is formed over a substrate 10. However, as illustrated in FIG. 1, conventional attempts to etch polysilicon layers to form double gate structures have encountered problems such as tapered/sloped sidewalls 20, re-entrant sidewalls 22, and notches 24 at the base of the structure.

Therefore, a method to efficiently form double gate structures with vertical sidewall profiles from the top of the control gate to the bottom of the floating gate is highly desirable in the semiconductor industry.

SUMMARY

The present invention provides an advantageous method of forming a double gate structure with substantially vertical sidewalls. One photoresist masking step is used to define the top gate. The top gate is then used as a mask to define the bottom gate. The bottom gate is etched by a physical and chemical process combination to achieve vertical sidewall profiles.

According to one embodiment of the present invention, a method of forming a double gate structure is provided, comprising providing a first polysilicon layer over a substrate and providing a second polysilicon layer over the first polysilicon layer. The second polysilicon layer is etched to form a control gate having sidewalls. Then a gas flow including a fluorocarbon is provided and a quantity of power is applied to the gas flow to form a plasma. The first polysilicon layer is etched with the plasma to form a floating gate having sidewalls substantially inline with the control gate sidewalls.

According to another embodiment of the present invention, a method of forming a double gate structure is provided, comprising etching the second polysilicon layer through a photoresist mask to form a control gate including sidewalls, wherein a first polymer is formed on the control gate sidewalls during the etch. The photoresist mask and the first polymer are then removed and a silicon oxide layer is provided over the control gate sidewalls. The first polysilicon layer is etched with the first plasma to form a floating gate including sidewalls substantially inline with the control gate sidewalls, wherein a second polymer is formed on the floating gate sidewalls during the etch.

According to yet another embodiment of the present invention, a method of forming a double gate structure is provided, comprising providing a dielectric stack over the first polysilicon layer, providing a second polysilicon layer over the dielectric stack, providing a silicon nitride layer over the second polysilicon layer, and providing a photoresist mask over the silicon nitride layer. The silicon nitride layer and the second polysilicon layer are etched through the photoresist mask to form a control gate including sidewalls, wherein a first polymer is formed on the control gate sidewalls during the etch. The method further comprises etching the dielectric stack to form sidewalls with substantially similar vertical profile as the control gate sidewalls and etching the first polysilicon layer with the first plasma to form a floating gate including sidewalls substantially inline with the control gate sidewalls, wherein a second polymer is formed on the floating gate sidewalls during the etch.

Advantageously, the present invention allows for a highly efficient process to form a double gate structure with substantially vertical sidewalls. The present invention allows for improved throughput and yield by using only one photoresist masking step which reduces process cycle time and the chance for defect.

These and other features and advantages of the present invention will be more readily apparent from the detailed description of the embodiments set forth below taken in conjunction with the accompanying drawings.

DETAILED DESCRIPTION

FIGS. 2–9 illustrate a process sequence utilizing a method to form a double gate structure with substantially vertical sidewalls. Advantageously, the present invention allows for double gate structures to be formed without sloped, re-entrant, or notched sidewalls. Furthermore, the present invention advantageously uses only one photoresist masking step and thereby improves manufacturing throughput, yield, and efficiency.

Figure 2:
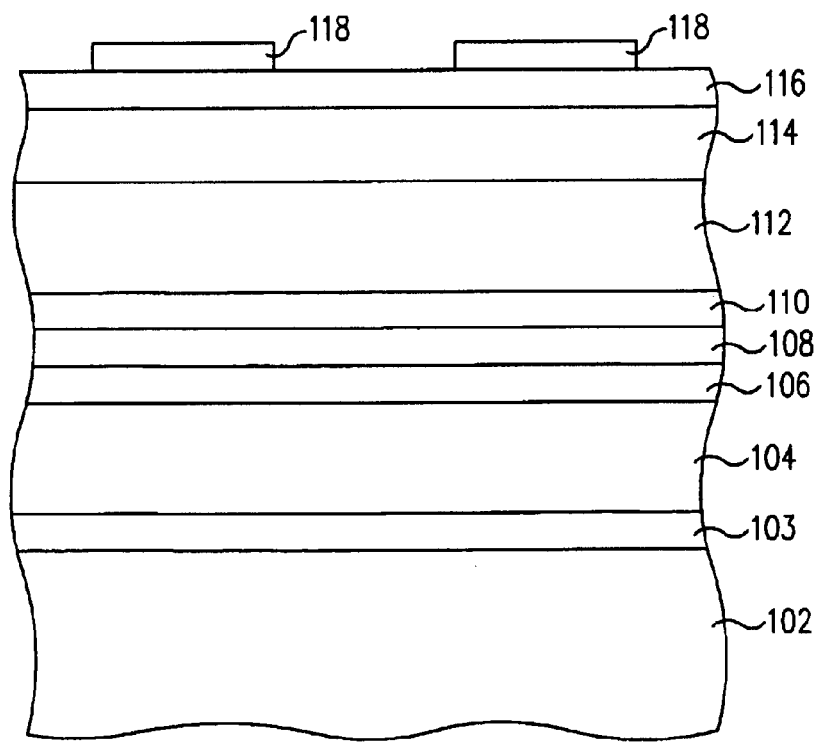
FIG. 2 shows a cross-section view of layers of material formed above a semiconductor substrate, in accordance with an embodiment of the present invention.

FIG. 2 illustrates a cross-section view of one example of a semiconductor device structure or portion of a semiconductor device structure in which the present invention may be used. As shown in FIG. 2, layers of material are formed over a semiconductor substrate 102, which may be doped by conventional means with dopants at different dosage and energy levels to form wells. Substrate 102 may be a wafer formed from a single crystalline silicon material. Substrate 102 may also comprise other materials, for example, an epitaxial material, a polycrystalline semiconductor material, or other suitable material. It is noted that substrate 102 can further include additional layers, structures, and/or devices.

As further shown in FIG. 2, a thin insulator layer 103 is formed over substrate 102. Insulator layer 103 acts as a tunnel oxide layer for the gate structures 126 (FIG. 9) that are eventually formed. Insulator layer 103 may comprise silicon dioxide, formed, for example, in a thermal furnace with an oxygen-containing ambient. It is noted that insulator layer 103 may comprise other materials suitable for insulating semiconductor elements. In one example, with no intent to limit the invention thereby, the thickness of insulator layer 103 may be between about 40 Å and about 80 Å.

A first polysilicon layer 104 is formed over insulator layer 103, as further illustrated in FIG. 2. First polysilicon layer 104 is eventually etched to define a bottom or floating gate of the double gate structure. In one embodiment, first polysilicon layer 104 comprises amorphous silicon and may be doped as the layer is deposited. In one example, dopants may comprise phosphorous and/or nitrogen. For example, to create n-type polysilicon material, phosphorous doping agents may be introduced at different dosage and energy levels.

In one example, with no intent to limit the invention thereby, first polysilicon layer 104 may be formed to a thickness between about 1,620 Å and about 1,980 Å by suitable deposition processes, such as a low pressure chemical vapor deposition (LPCVD) process. It is noted that the invention is not limited to the aforementioned example but can involve various polysilicon layer thicknesses depending upon desired gate fabrication.

A stack of dielectric layers is then formed over first polysilicon layer 104. In the embodiment illustrated in FIG. 2, an oxide-nitride-oxide (ONO) stack including a silicon oxide layer 106, a silicon nitride layer 108, and a silicon oxide layer 110, respectively, are formed above first polysilicon layer 104. In one example, with no intent to limit the invention thereby, silicon oxide layer 106, silicon nitride layer 108, and silicon oxide layer 110, may be formed to a thickness of about 50 Å, 80 Å, and 40 Å, respectively, by suitable deposition processes.

Referring again to FIG. 2, a second polysilicon layer 112 is formed over oxide layer 110. Second polysilicon layer 112 is eventually etched to define a top or control gate of the double gate structure. In one embodiment, similar to first polysilicon layer 104, second polysilicon layer 112 comprises amorphous silicon and may be doped as the layer is deposited. In one example, dopants may comprise phosphorous and/or nitrogen. For example, to create n-type polysilicon material, phosphorous doping agents may be introduced at different dosage and energy levels. In one example, with no intent to limit the invention thereby, second polysilicon layer 112 may be formed to a thickness between about 1,620 Å and about 1,980 Å by suitable deposition processes.

A nitride layer 114 is formed over second polysilicon layer 112. In one example, with no intent to limit the invention thereby, nitride layer 114 may be formed to a thickness between about 1,350 Å and about 1,650 Å by suitable deposition processes. An anti-reflective coating (ARC) layer 116 is formed over nitride layer 114. Thereafter, a photoresist mask 118 is formed over ARC layer 116 for patterning of underlying layers to etch the double gate structures. Photoresist mask 118 may be defined using standard photoresist coating, exposure, and development processes known in the conventional lithography technology.

Figure 3:
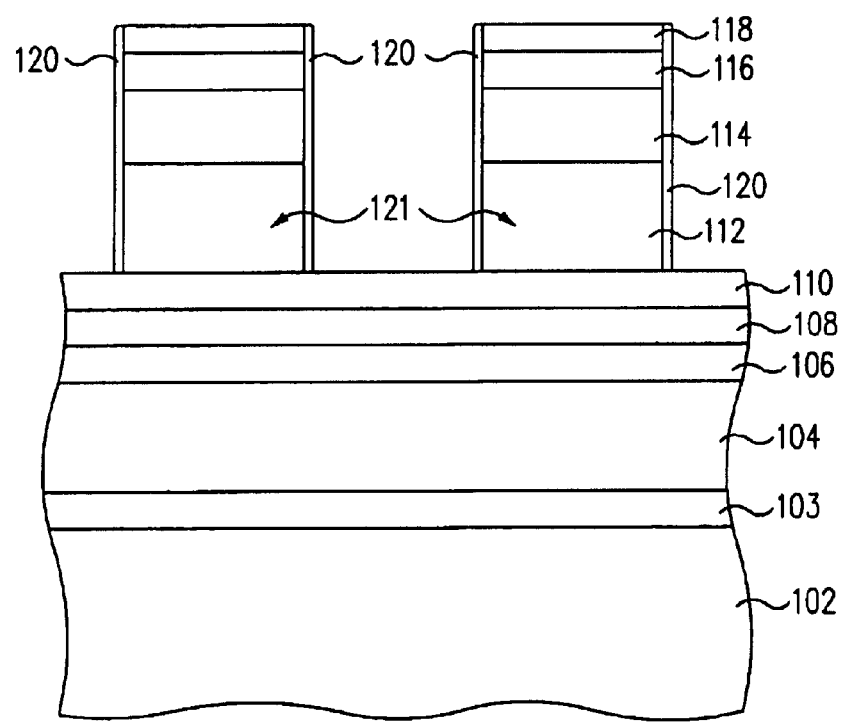
FIG. 3 shows a cross-section view of the structure illustrated in FIG. 2 after a first etch step through a photoresist mask to define a top gate, in accordance with an embodiment of the present invention.

Referring now to FIG. 3, ARC layer 116, nitride layer 114, and second polysilicon layer 112 are anisotropically etched through photoresist mask 118 to define a top gate or control gate 121 of the double gate structure. This step can be performed by anisotropic etch processes, such as reactive ion etch (RIE) processes using hydrogen bromide, chlorine, and oxygen.

Figure 1:
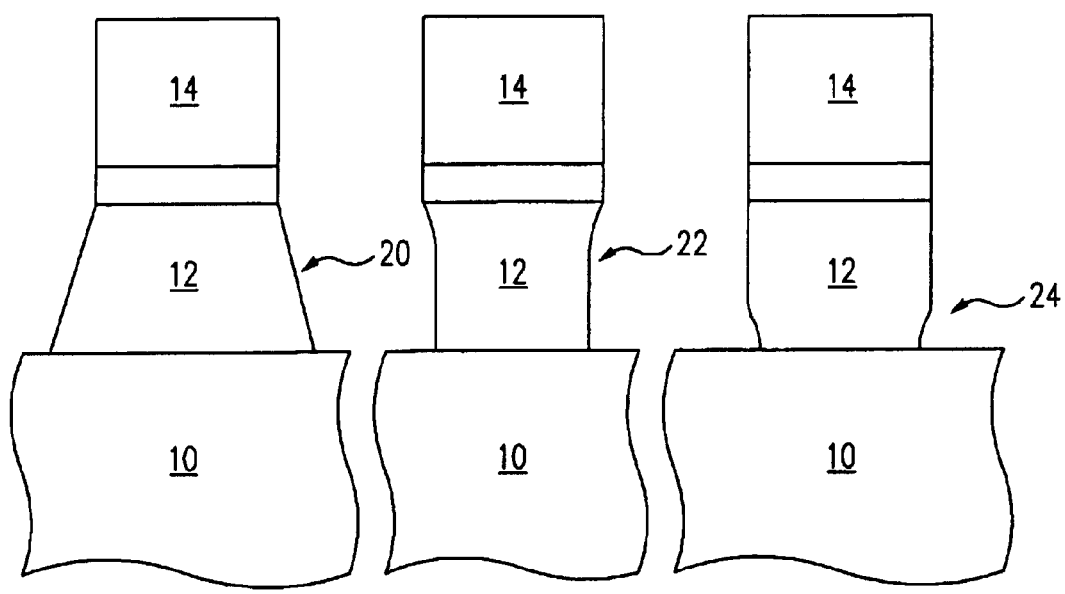
FIG. 1 shows conventional problems encountered when etching polysilicon to form a double gate structure.

If the flux of reactants onto the wafer surface is randomly directed, then the end result will be isotropic etching, resulting in problems such as sloped, re-entrant, and notched sidewalls, as illustrated in FIG. 1.

The definition of anisotropic etching is the ratio of polysilicon etch rate in the perpendicular direction extending along the Z-axis perpendicular to the polysilicon layer, versus the polysilicon etch rate in the lateral direction extending across the polysilicon layer along the X and Y axes. Vertical sidewall profile is of supreme importance in metal-oxide-semiconductor (MOS) devices because any deviation from vertical will increase the range of transistor widths, resulting in speed variations within the chip at a given design rule.

Energetic ions in the Z-direction accelerated by either the electric field of plasma sheath, or the induced bias voltage on the wafer surface, can only make up part of the directionality requirement. Anisotropic etching with lateral protection in the X and Y directions allows for the formation of vertical sidewalls. Such protection is accomplished by process chemistry through the formation of sidewall passivant. The source of sidewall passivation comes from intentionally eroding photoresist mask 118 during the etch step. In one example, plasma from hydrogen bromide (HBr), chlorine gas ($Cl_2$), and oxygen ($O_2$), are used for the anisotropic etch of second polysilicon layer 112. Polymeric chlorocarbons of the form $C_xCl_y(s)$, where x and y are integers greater than zero (0) that allow for stoichiometry, are produced as a reaction by-product. The polymeric chlorocarbons are formed from gas phase reactions between $Cl_2$, one of the active species for etching polysilicon, and carbon, the main ingredient in the organic resist.

The anisotropy in FIG. 3 is achieved, in part, by energetic ion bombardment impinging the wafer surface in the vertical direction, while the organic mask is etched chemically by oxygen and chlorine atoms, producing a host of by-products including CO, $CO_2$, $NO_2$, $H_2O$, and the non-volatile $C_xCl_y(s)$ for sidewall protection. An equation describing this reaction is provided below. The organic resist mask is denoted as $C_xH_yN_z$ in the equation.

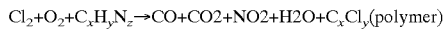

$$Cl_2+O_2+C_xH_yN_z \rightarrow CO+CO_2+NO2+H2O+C_xCl_y(polymer)$$

The structure illustrated in FIG. 3 is the result after the aforementioned anisotropic etch has been performed. A first polymer 120 including $C_xCl_y(s)$ is deposited along the sidewalls of the etched control gate 121 during the gate formation such that vertical profiles are achieved. Thus, chemical precursors $C_xCl_y(s)$ polymerizing onto the vertical surfaces of the top gate during its formation inhibit lateral etch components in the X and Y directions and allow for sidewalls with a vertical profile. The anisotropic etch is terminated upon fully defining control gate 121 and upon reaching the top of oxide layer 110.

Figure 4:
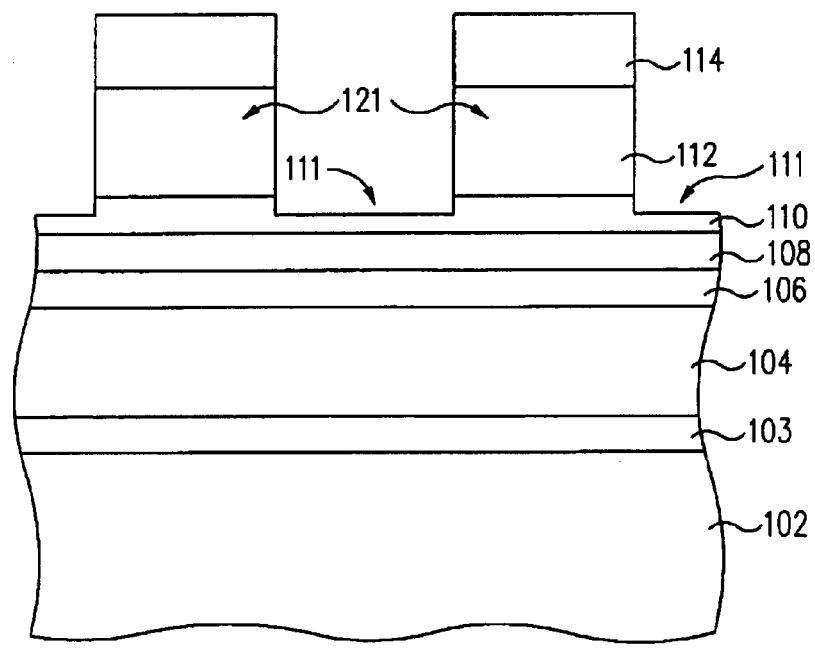
FIG. 4 shows a cross-section view of the structure illustrated in FIG. 3 after the photoresist mask is stripped, in accordance with an embodiment of the present invention.

Photoresist layer 118 and ARC layer 116 are then stripped from the top of the gate structures by a conventional process, such as a resist ash, in one example, resulting in the structure illustrated in FIG. 4. During this strip step, a top portion of oxide layer 110 is removed, as designated by space 111. It is noted that when photoresist layer 118 is stripped, first polymer 120 is also removed from the sidewalls of control gate 121.

Figure 5:
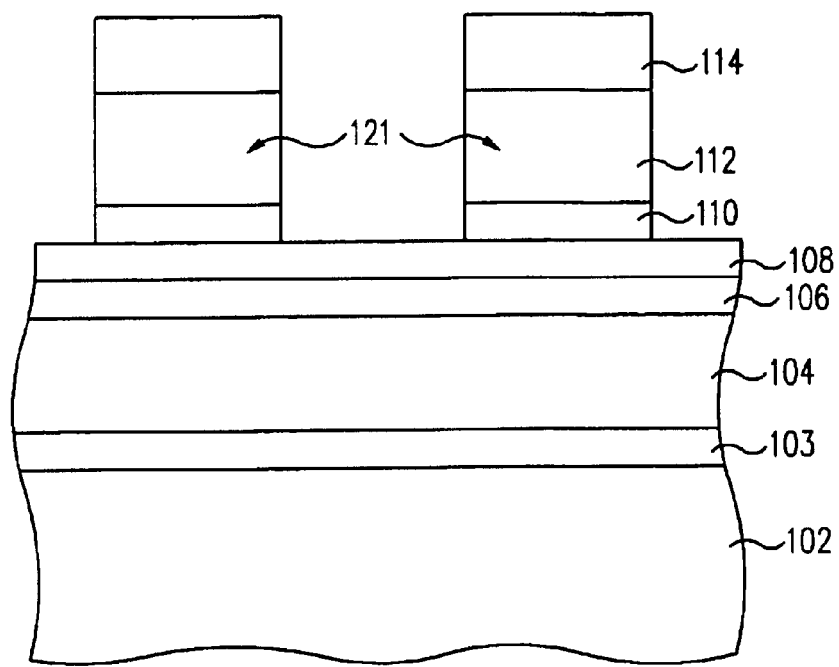
FIG. 5 shows a cross-section view of the structure illustrated in FIG. 4 after a wet etch step to completely etch exposed portions of a top oxide layer, in accordance with an embodiment of the present invention.

FIG. 5 illustrates a further etching step to remove exposed portions of oxide layer 110. In one example, exposed portions of oxide layer 110 are removed by a wet etch using buffered oxide etchant (BOE) in a conventional wet etch tank. Advantageously, the BOE wet etch is highly selective to oxide over polysilicon. Accordingly, the profile of the control gate sidewalls remains substantially vertical. In another example, diluted HF solution may also be used for this wet etch step.

Figure 6:
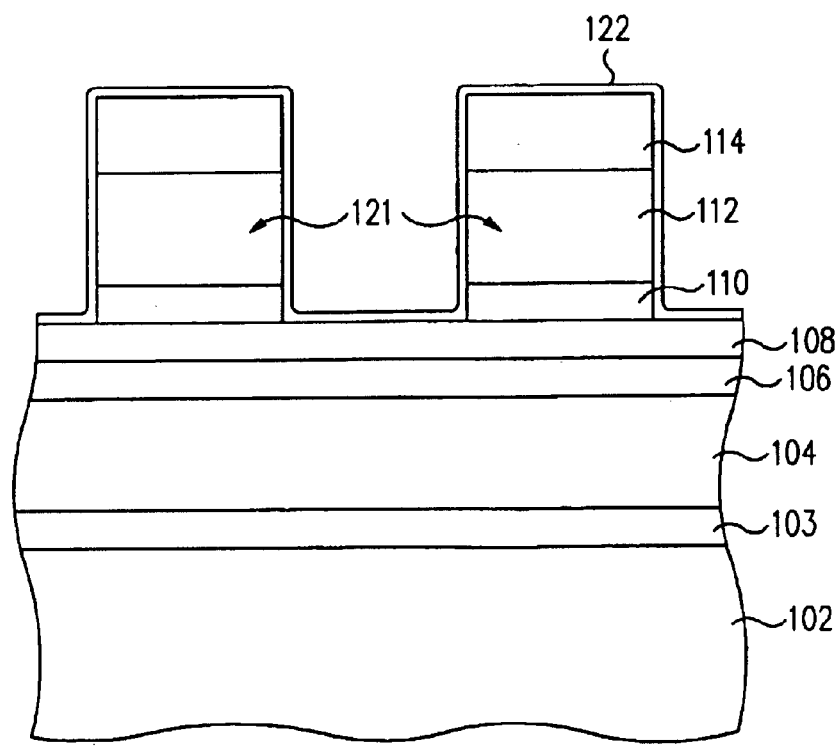
FIG. 6 shows a cross-section view of the structure illustrated in FIG. 5 after an oxide layer is formed over the sidewalls of the top gate, in accordance with an embodiment of the present invention.

FIG. 6 illustrates a conformal oxide layer 122 that is grown or deposited over the topography of the structure illustrated in FIG. 5. Oxide layer 122 protects the sidewalls of control gate 121 during subsequent etch steps.

In one embodiment, oxide layer 122 may be grown over the topography of the gate structures by a thermal oxide process in which oxide layer 122 is grown as thinly as possible to allow for higher circuit densities. However, oxide layer 122 must also be of sufficient thickness to act as an etch stop to protect against removal of portions of the gate structures during subsequent etch steps. In one example, with no intent to limit the invention thereby, oxide layer 122 has a thickness between about 30 Å and about 40 Å and is conformally formed over portions of nitride layer 108, oxide layer 110, polysilicon layer 112, and nitride layer 114. Oxide layer 122 may be grown by performing thermal oxidation in any applicable apparatus, such as a furnace. The thermal oxidation may be performed at a temperature between about 700° C. and about 900° C. with a deposition time between about 10 minutes and about 30 minutes, in one example. Process gases may include $O_2$ or $O_2$ including $N_2$. It will be apparent that the above process parameters are examples and will be dependent upon layer thickness and other desired specifications.

In other embodiments, oxide layer 122 may be deposited by an HDP-CVD process, preferably conformally, over portions of nitride layer 108, oxide layer 110, polysilicon layer 112, and nitride layer 114. In one example, oxide layer 122 is deposited using a source radio frequency (RF) for generating radicals in the HDP-CVD process but no bias power or low bias power is applied to the substrate. Low or no bias power prevents damage to the underlying device potentially caused by etching/sputtering.

It should be understood that oxide layer 122 is not limited to having a uniform thickness but may instead have a non-uniform thickness, for example, having a larger thickness over horizontal surfaces than along vertical sidewalls. In one example, oxide layer 122 may comprise silicon dioxide, formed from reaction gases such as silane ($SiH_4$), oxygen ($O_2$), and helium (He). It should be further understood that oxide layer 122 may comprise other applicable oxide layers, alone or in combination, at various thicknesses to prevent damage to the polysilicon (and/or underlying layers) during subsequent etch steps.

Figure 7:
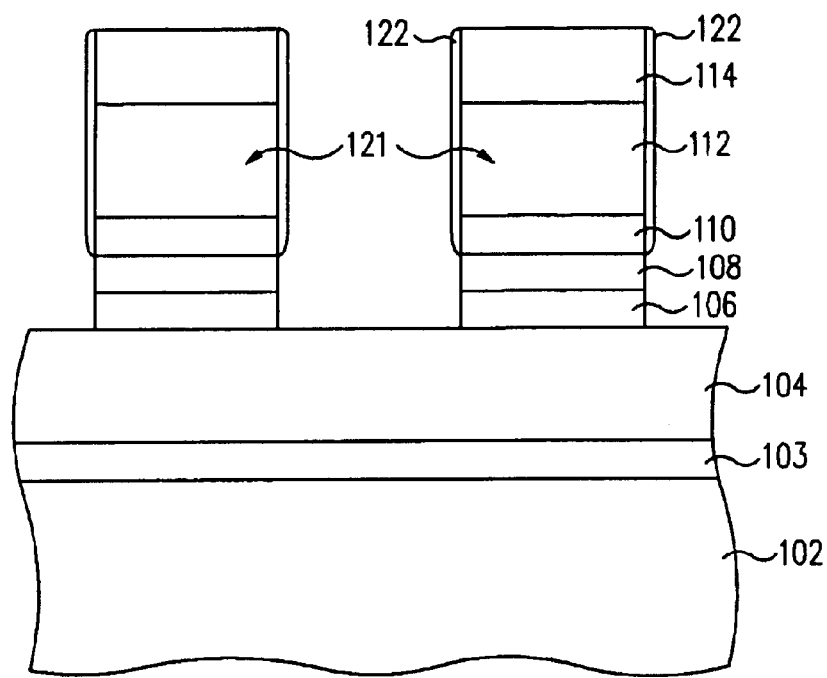
FIG. 7 shows a cross-section view of the structure illustrated in FIG. 6 after exposed portions of the dielectric stack is etched, in accordance with an embodiment of the present invention.

FIG. 7 illustrates a subsequent etch to remove exposed portions of the remaining layers of the ONO stack. In one example, nitride layer 108 is isotropically etched using a dry etchant, such as $SF_6$. Advantageously, the dry plasma etch is sufficiently isotropic to remove residue of nitride between the stack structures while still maintaining vertical sidewall profiles (since nitride layer 108 is of relatively small thickness). Oxide layer 106 is etched using a wet etchant with the remaining nitride layer 108 acting as a hard mask. The wet etch is highly selective to oxide such that vertical sidewall profiles are maintained. It is further noted that during these etch steps, oxide layer 122 protects the sidewalls of control gate 121 from etchant material.

According to the embodiment described above, the top half of the double-polysilicon structure, including control gate 121, has been defined in part by using a photoresist mask. Reactions with the organic resist provide sufficient sidewall protection, steering plasma etch of the control gate towards a balanced approach between physical bombardment and chemical etch. In contrast, the etch of the bottom half of the double-gate structure, including the floating gate, is performed without a photoresist step, as described in greater detail below.

Figure 8:
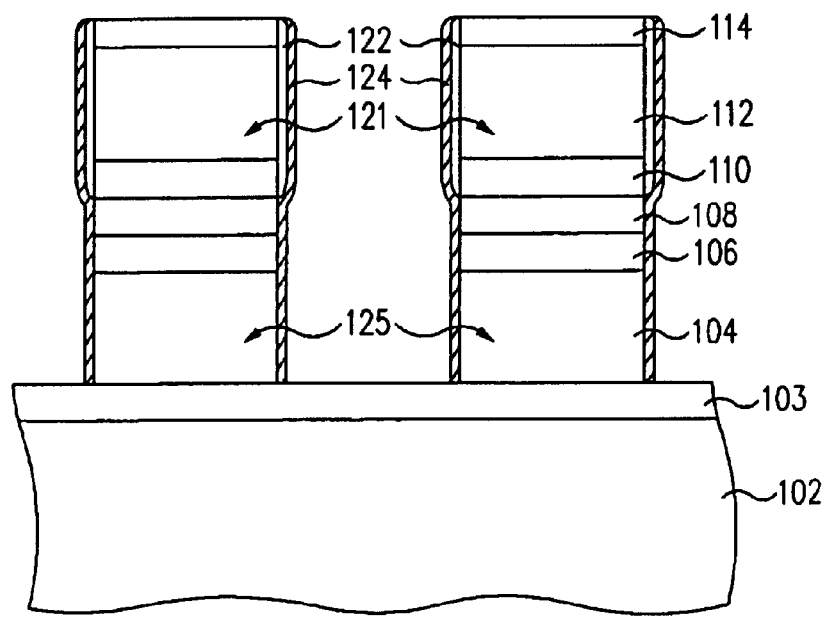
FIG. 8 shows a cross-section view of the structure illustrated in FIG. 7 after the bottom polysilicon layer is etched while forming a protective polymer on the sidewalls, in accordance with an embodiment of the present invention.

FIG. 8 illustrates the etch of first polysilicon layer 104 to define a bottom gate or a floating gate 125. Incident ion energy alone is insufficient to form vertical sidewalls. Therefore, to achieve anisotropy without photoresist, a new gas additive, $CH_2F_2$, is included in the feed-gas mixture, thereby altering the balance between physical bombardment and chemical etch in the plasma. Polymer molecules of the form $(CH_2)_n$, where n is an integer, are dissociated from the $CH_2F_2$ and are deposited on the sidewalls of the double gate structures during the etch of first polysilicon layer 104. Polymers $(CH_2)_n$ protect polysilicon sidewalls during the etch of first polysilicon layer 104 and are adequate substitutions for the $C_xCl_y(s)$ polymers. Both the existing top-half of the double gate structure, and the yet to be defined bottom-half of the double gate structure need polymer depositions to form sidewalls having vertical profiles.

In one example, the process parameters for the etch of first polysilicon layer 104 are a percentage of HBr in the gas-mixture, flow rates of $CH_2F_2$ and $O_2$ (with He carrier gas), and a flow ratio of $CH_2F_2$ and $O_2$. The parameter ranges for the new HBr-based chemistry with $CH_2F_2$ and $O_2$ as gas additives is summarized in Table 1 below. While the $CH_2F_2$ additive supplies additional sidewall passivant, the $O_2$ improves the selectivity to thin tunnel oxide 103 underneath the floating polysilicon gate. Although the $SiBr_x$ species, a primary etch product from reactions with the polysilicon, can passivate the vertical surface of polysilicon, the protection from the $SiBr_x$ species alone is marginal without the additional sidewall protection from polymer layer 124 including $(CH_2)_n$, as illustrated in FIG. 8.

An injection of about 3 sccm or about 1% by volume of $CH_2F_2$ into the HBr-based chemistry has resolved problems related to hard mask erosion and sloping, re-entrant, and/or notched sidewalls by enhancing sidewall passivant protection of the top control gate and the bottom floating gate.

Advantageously, the present invention precisely transfers the image of a mask, either organic photoresist or self-aligned hard mask, onto the polysilicon with vertical profile and in a reproducible manner. A bottom floating gate is formed with sidewalls substantially inline with the sidewalls of the top control gate. The top and bottom gates are etched to have sidewalls substantially along a common line without sloping, re-entrant, or notched sidewalls. In other words; bottom floating gate 125 is formed with sidewalls substantially parallel and inline with respective sidewalls of control gate 121. A robust record of 0.172-$\mu$m width for the double gate structure has demonstrated the new chemistry's reproducibility and usefulness in semiconductor fabrication.

Furthermore, the present invention allows for discriminating selectivity: etching of the bottom polysilicon layer while using nitride layer 108 as a mask without degradation of the top polysilicon gate. Advantageously, the rate of polysilicon consumption is controlled such that while one layer (e.g., the bottom polysilicon layer) is being defined, the existing feature (e.g., the top polysilicon gate) remains intact without a mask.

There are three types of dry etch processes: those that have a physical basis (e.g., ion beam milling), those that have a chemical basis (e.g., non-plasma assisted chemical etching), and those that combine both physical and chemical mechanisms (e.g., reactive ion etching and some types of plasma-assisted etching). Primarily physical dry etch methods may not exhibit sufficient selectivity of the superjacent layer over the underlying layer causing punchthrough of the underlying layer. On the other hand, primarily chemical processes typically etch isotropically and therefore do not form vertical sidewalls. Consequently, chemically enhanced ion etching processes that combine the two mechanisms are preferred.

Accordingly, in one embodiment, the method of the present invention utilizes a dry etch involving simultaneous ion bombardment and polymerizing chemistry to etch first polysilicon layer 104. The degree of anisotropy and selectivity, as well as other factors such as the etch rate, are determined by a variety of parameters. These parameters include the quantity of power supplied to produce the plasma, the type and flow rate of etchant gas used to etch the polysilicon, and the pressure within the reaction chamber.

Table 1 below provides process parameter ranges in accordance with one embodiment of the present invention for etching polysilicon layers 112 and 104 to form top and bottom gates, respectively, having sidewalls inline with one another and with substantially vertical profiles, without violating the integrity of the underlying oxide layer. However, one having ordinary skill in the art will realize that the values will vary depending on the make and model of the etcher used in the process and the geometry of the gate structures involved.

TABLE 1

| Process Parameter | Top Polysilicon Etch | Bottom Polysilicon Etch |
|---|---|---|
| HBr Flow Rate (sccm) | 168 (±17) | 100–300 |
| HBr % (by volume) | 78.2 | 93–97 |
| $Cl_2$ Flow Rate (sccm) | 42 (±4) | 0 |
| $Cl_2$ % (by volume) | 19.5 | 0 |
| $O_2$/He (20% $O_2$) Flow Rate (sccm) | 5 (±0.5) | 5–10 |
| $O_2$ % (by volume) | 0.4 | 0.4–1.0 |
| $CH_2F_2$ Flow Rate (sccm) | 0 | 3–5 |
| $CH_2F_2$ % (by volume) | 0 | 1–3 |

TABLE 1-continued

| Process Parameter | Top Polysilicon Etch | Bottom Polysilicon Etch |
|---|---|---|
| Transformerly Coupled Plasma (TCP) Power (W) | 300 (±30) | 500–600 |
| Wafer Biasing RF Power (W) | 50 (±5) | 40–60 |
| Process Pressure (mTorr) | 10 (±1) | 10–20 |

In one specific embodiment, the etch of polysilicon layer 104 is performed in a commercially available 9400 DFM plasma reactor from Lam Research Corporation ("Lam") of Fremont, Calif., described in U.S. Pat. No. 6,218,309 and incorporated by reference herein.

The Lam plasma reactor includes a plasma processing chamber with a chamber wall. To provide an electrical path to ground, the chamber wall is typically grounded. Above the chamber is disposed an inductive electrode powered by a first power source, such as a radio frequency (RF) power source.

Typically, a gas port is provided within the chamber and is arranged for releasing gaseous source materials, e.g., the etchant source gases, into the RF-induced plasma region. In one example, the gaseous source materials may be released from ports built into the bottom of the chamber itself.

In one embodiment, a wafer such as that shown in FIG. 7 is introduced into the chamber and disposed on a chuck or pedestal, which acts as a bottom electrode and is preferably biased by a second power source. The chuck may be, in one example, an electrostatic chuck, which secures substrate 102 to the chuck's surface by electrostatic force.

By applying power to the top electrode which is external to the reactor, a plasma may be created within the chamber by causing the molecules of one or more of the inflowing gases to disassociate into respective submolecular constituents (e.g., free radicals or free ions). Power is applied to the electrostatic chuck or pedestal to attract ionized molecules in the plasma toward the wafer surface for sputter etching.

An exhaust port is typically disposed on one side of the chamber and coupled to a pump typically located outside of the chamber. The pump maintains the desired pressure inside the chamber.

Further, the reactor may be controlled by a programmable computer that is programmed to automate the processing of the wafer, including venting of the chamber, transfer of wafers to and from loading modules, and delivery of process gas and electrode power.

It is apparent that although the Lam reactor has been employed and described above as the apparatus for etching polysilicon layer 104 and has shown particularly good results, other plasma reactors that are suitable for dry etching may be used.

In preparation for the etch of polysilicon layer 104, a first gas flow is circulated through the reaction chamber. The first gas flow includes a first fluorocarbon component and optionally includes an inert gas component. An attribute often used to characterize plasmas formed from such a feed gas is the ratio of fluorine atoms to carbon atoms ("F:C ratio") within the feed gas. The F:C ratio may also be used to describe a fluorocarbon molecule. The types and flow rates of etchant gases used in dry etch processes may be chosen to manipulate the F:C ratio of the gas flow and thereby control the plasma etch rate and selectivity to certain species.

In one embodiment of the present invention, the first fluorocarbon component includes $CH_2F_2$. The flow rate of $CH_2F_2$ in the first gas flow is between about 3 sccm and about 5 sccm, and is preferably about 3 sccm. $CH_2F_2$ comprises between about 1% and about 3% total concentration by volume of the first gas flow.

For the etch of first polysilicon layer 104, the process pressure within the reaction chamber is set at between about 10 mT and about 20 mT, and is preferably set at about 10 mT. As previously described for one embodiment, a vacuum means, such as a turbo-molecular pump, is provided to exhaust gases from the reaction chamber and to thereby create the desired pressure within the chamber.

The pressure and gas flow into the reaction chamber are maintained at the selected levels for a time sufficient to allow for stabilization of the gas flow rates and reaction chamber pressure. Once the environment within the reaction chamber is sufficiently stabilized, the electrodes of the reaction chamber are powered, a first plasma is formed within the reactor chamber, and the etch of first polysilicon layer 104 is performed to form bottom floating gate 125, as shown in FIG. 8.

In this etch step, the external electrode power used by the plasma etcher to generate reactive species is set at between about 500 W and about 600 W and is preferably set at about 550 W. The wafer bias power that biases the wafer to attract ionic species to strike the substrate surface is set at between about 40 W and about 60 W and is preferably set at about 50 W.

The bombardment of ions from the first plasma, in conjunction with the diffusion of chemically reactive species from the plasma to the sidewalls of the double gate structures for polymer deposition and carbon accumulation allows polysilicon layer 104 to be etched in a highly directional manner but with selectivity to oxide.

Polymer formation plays an important role in slowing the dry etch rate and allowing for greater selectivity. $CH_2F_2$ produces a polymer deposition of the form $(CH_2)_n$ on the etched surface that acts to passivate the surface and thereby reduces the dry etch removal rate. Another source of polymer passivation is carbon accumulation on the surface from the dissociation of $CF_4$ into $CF_3^+$ upon low energy impacts.

The effects from the above described mechanisms, involving either the physical bombardment component or the chemical polymer deposition component, can be magnified or reduced to form polysilicon gates with substantially vertical profiles, high uniformity, and high selectivity.

The etch of first polysilicon layer 104 is preferably continued until the bottom floating gate is formed with oxide layer 103 remaining intact between the double gate structures. The etch step may be discontinued using endpoint detection mechanisms such as optical emission spectroscopy and mass spectroscopy, which can provide signals for etch byproducts. In one example, signals from the etch process are detected at about the 405 nm wavelength. In a further example, the etch step may be discontinued near the point of detection of oxide layer etching, determined to be the endpoint. The total time needed to etch polysilicon layer 104 is dependent upon the thickness of polysilicon layer 104. Upon completion of this etch step, the supply of power to the electrodes of the reaction chamber is discontinued.

To increase selectivity during the etch step, several different parameters may be manipulated. An elevated process pressure decreases incident velocities of the etching radicals upon the substrate topography. Not including an inert gas component lessens ion sputtering. Higher power for plasma formation sustains the formation of reactive species for carbon accumulation and polymer depositions on the etched surface, which lower the etch rate. Conversely, when the pressure and plasma power are both lowered, ions begin striking the substrate more vigorously but at a lower concentration level of reactive species, thereby allowing for lower selectivity but higher anisotropic etching for creating vertical sidewalls.

Figure 9:
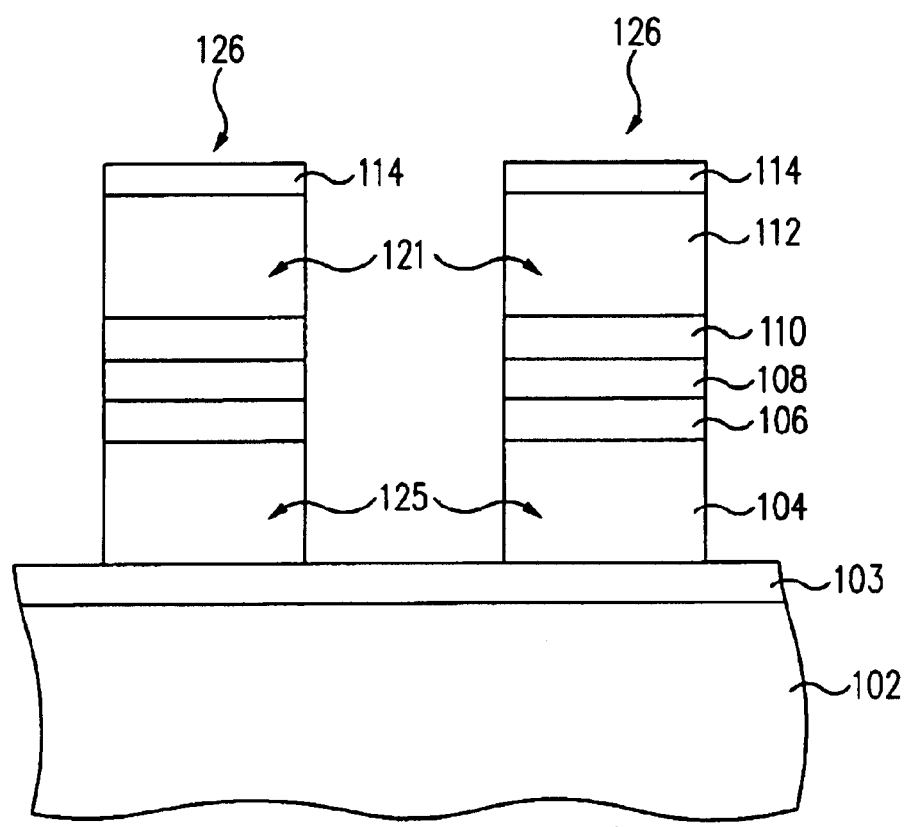
FIG. 9 shows a cross-section view of the structure illustrated in FIG. 8 after the polymer is cleaned off the double gate structure and the nitride layer is removed, in accordance with an embodiment of the present invention.

FIG. 9 illustrates double gate structures 126 after $(CH_2)_n$ polymer layer 124 and oxide layer 122 are cleaned off, for example by a conventional RCA clean process.

The above-described embodiments of the present invention are merely meant to be illustrative and not limiting. Various changes and modifications may be made without departing from this invention in its broader aspects. Accordingly, the invention is not limited to particular structures, dimensions, or process parameters. Therefore, the appended claims encompass all such changes and modifications as falling within the true spirit and scope of this invention.

We claim:

1. A method to form a double gate structure, comprising:
   providing a first polysilicon layer over a substrate;
   providing a second polysilicon layer over the first polysilicon layer;
   etching the second polysilicon layer through a photoresist mask to form a control gate having sidewalls, wherein a first polymer is formed on the control gate sidewalls during the etch;
   providing a gas flow including a fluorocarbon;
   applying a quantity of power to the gas flow to form a plasma; and
   etching the first polysilicon layer with the plasma to form a floating gate having sidewalls substantially inline with the control gate sidewalls wherein a second polymer is formed on the floating gate sidewalls during the etch, the second polymer being different than the first polymer.

2. The method of claim 1, wherein the first polysilicon layer has a thickness between about 1,620 Å and about 1,980 Å.

3. The method of claim 1, wherein the second polysilicon layer has a thickness substantially similar to the thickness of the first polysilicon layer.

4. The method of claim 1, wherein the control gate sidewalls and floating gate sidewalls have a substantially similar vertical profile.

5. The method of claim 4, wherein the control gate and the floating gate have a width between about 0.14 µm and about 0.18 µm.

6. The method of claim 1, wherein the gas flow includes $CH_2F_2$, $O_2$, and HBr.

7. The method of claim 6, wherein the gas flow includes $CH_2F_2$ and $O_2$ at a flowrate ratio of about 3:5.

8. The method of claim 6, wherein the gas flow includes HBr at a flow rate between about 100 sccm and about 300 sccm.

9. The method of claim 6, wherein the gas flow includes $CH_2F_2$ at a flow rate between about 3 sccm and about 5 sccm.

10. The method of claim 6, wherein the gas flow includes about 1% by volume of $CH_2F_2$.

11. The method of claim 6, wherein the gas flow includes $O_2$ and He (at 20% $O_2$) at a flow rate between about 5 sccm and about 10 sccm.

12. The method of claim 1, wherein a polymer is formed on the floating gate sidewalls during the etch to protect the floating gate sidewalls from etching material.

13. The method of claim 12, wherein the polymer includes $(CH_2)_n$ where n is an integer.

14. The method of claim 1, further comprising providing a silicon oxide layer above the substrate and under the first polysilicon layer.

15. The method of claim 14, wherein the silicon oxide layer has a thickness between about 40 Å and about 80 Å.

16. The method of claim 1, further comprising:
providing a dielectric stack between the first polysilicon layer and the second polysilicon layer; and
etching the dielectric stack to form sidewalls with substantially similar vertical profile as the control gate sidewalls.

17. The method of claim 1, further comprising:
providing a silicon nitride layer above the second polysilicon layer; and
etching the silicon nitride layer through the photoresist mask.

18. A method of forming a double gate structure, comprising:
providing a first polysilicon layer over a substrate;
providing a second polysilicon layer over the first polysilicon layer;
etching the second polysilicon layer through a photoresist mask to form a control gate including sidewalls, wherein a first polymer is formed on the control gate sidewalls during the etch wherein the first polymer includes $C_xCl_y$, where x and y are integers;
removing the photoresist mask and the first polymer;
providing a silicon oxide layer over the control gate sidewalls;
providing a first gas flow including a fluorocarbon;
applying a first quantity of power to the first gas flow to form a first plasma; and
etching the first polysilicon layer with the first plasma to form a floating gate including sidewalls substantially inline with the control gate sidewalls, wherein a fluorocarbon polymer is formed on the floating gate sidewalls during the etch.

19. The method of claim 18, wherein the silicon oxide layer over the control gate sidewalls has a thickness between about 30 Å and about 40 Å.

20. The method of claim 19, wherein the second polymer includes $(CH_2)_n$ where n is an integer.

21. A method of forming a double gate structure, comprising:
providing a first polysilicon layer over a substrate;
providing a dielectric stack over the first polysilicon layer;
providing a second polysilicon layer over the dielectric stack;
providing a silicon nitride layer over the second polysilicon layer;
providing a photoresist mask over the silicon nitride layer;
etching the silicon nitride layer and the second polysilicon layer through the photoresist mask to form a control gate including sidewalls, wherein a first polymer of $C_xCl_y$, where x and y are integers is formed on the control gate sidewalls during the etch;
removing the photoresist mask and the first polymer;
providing a silicon oxide layer over the control gate sidewalls;
etching the dielectric stack to form sidewalls with substantially similar vertical profile as the control gate sidewalls;
providing a first gas flow including a fluorocarbon;
applying a first quantity of power to the first gas flow to form a first plasma; and
etching the first polysilicon layer with the first plasma to form a floating gate including sidewalls substantially inline with the control gate sidewalls, wherein a fluorocarbon polymer is formed on the floating gate sidewalls during the etch.

22. The method of claim 21, wherein the dielectric stack includes a nitride layer between two oxide layers.

23. The method of claim 21, wherein the second polymer includes $(CH_2)_n$ where n is an integer.

* * * * *